(12) United States Patent
Wieland

(10) Patent No.: US 9,887,707 B2
(45) Date of Patent: Feb. 6, 2018

(54) METHOD AND DEVICE FOR GENERATING A DECODED AND SYNCHRONIZED OUTPUT

(71) Applicant: Mapper Lithography IP B.V., XK Delft (NL)

(72) Inventor: Marco Jan-Jaco Wieland, XK Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 28 days.

(21) Appl. No.: 15/198,487

(22) Filed: Jun. 30, 2016

(65) Prior Publication Data

US 2018/0006668 A1    Jan. 4, 2018

(51) Int. Cl.
*H03M 13/29* (2006.01)
*H04L 1/00* (2006.01)
*H04L 27/227* (2006.01)

(52) U.S. Cl.
CPC ...... *H03M 13/2927* (2013.01); *H04L 1/0041* (2013.01); *H04L 1/0045* (2013.01); *H04L 27/2278* (2013.01)

(58) Field of Classification Search
CPC ......... H03M 13/2927; H03M 13/2906; H03M 13/29; H03M 13/00; H03M 9/00; H04L 1/0041; H04L 1/0045; H04L 27/22; H04L 27/2277; H04L 27/2278
See application file for complete search history.

(56) References Cited

U.S. PATENT DOCUMENTS

| 4,486,739 A | 12/1984 | Franaszek et al. |
| 5,148,453 A | 9/1992 | Newby et al. |
| 5,648,776 A * | 7/1997 | Widmer .................. H03M 9/00 341/100 |
| 7,405,679 B1 | 7/2008 | Widmer |

(Continued)

FOREIGN PATENT DOCUMENTS

| EP | 0097763 A2 | 1/1984 |
| EP | 0 097 763 | 9/1988 |
| WO | WO-9641439 A1 | 12/1996 |

OTHER PUBLICATIONS

"Data Interchange on Read-Only 120 mm Optical Data Disks (CD-ROM)", Standard ECMA-130, 2nd Edition, Jun. 1996, pp. 1-45.

(Continued)

*Primary Examiner* — Christine Tu
(74) *Attorney, Agent, or Firm* — Blakely Sokoloff Taylor & Zafman, LLP; Eric S. Hyman

(57) ABSTRACT

The invention relates to a invention relates to a method and decoding device for receiving an input bit-stream comprising a sequence of n-bit pattern symbols as well as a unique n-bit comma symbol for synchronization, and for generating therefrom a synchronized output comprising a sequence of m-bit pattern words, with m<n. The comma symbol allows detection of bit-skip in the input bit-stream, so that the output to be synchronized to compensate for the bit-skip. The decoding device and method of decoding are particularly simple and may be applied in devices, e.g. in a beam modulator array comprising a plurality of decoding devices, and/or in a lithography system comprising such a beam modulator array, in which space and computational resources are scarce while still providing a synchronization capability.

25 Claims, 11 Drawing Sheets

(56) References Cited

U.S. PATENT DOCUMENTS

| 9,455,745 B2* | 9/2016 | Tantos | H03M 5/145 |
| 2003/0161429 A1* | 8/2003 | Chiang | H03M 9/00 |
| | | | 375/371 |
| 2009/0195421 A1 | 8/2009 | Kim et al. | |
| 2014/0254724 A1 | 9/2014 | Gopalan | |

OTHER PUBLICATIONS

Immink, K.A. Schouhamer, "Codes for Mass Data Storage Systems, Chapter 5, 8 and 11", Shannon Foundation Publishers, 2004, pp. 95-136, 195-242, 277-304.

Sadka, A. H., et al. "Aspects of Error Resilience for Block-based Video Coders in Multimedia Communications." Insights into Mobile Multimedia Communications. Ed. D.R. Bull, et al. San Diego: Academic Press 1999. pp. 431-443.

Hakkennes, E.A., et al, "Demonstration of Real Time pattern correction for high throughput maskless lithography" Proc. of SPIE, vol. 7970, 79701A. pp. 1-11. (2011).

Coles, A. "Error Reporting and Synchronization Recovery." pp. 1-10. (1998).

Wikipedia Article entitled "8b/10b encoding." Retrieved from "https://en.wikipedia.org/wiki/8b/10b_encoding" on Jan. 14, 2016. 8 pages.

* cited by examiner

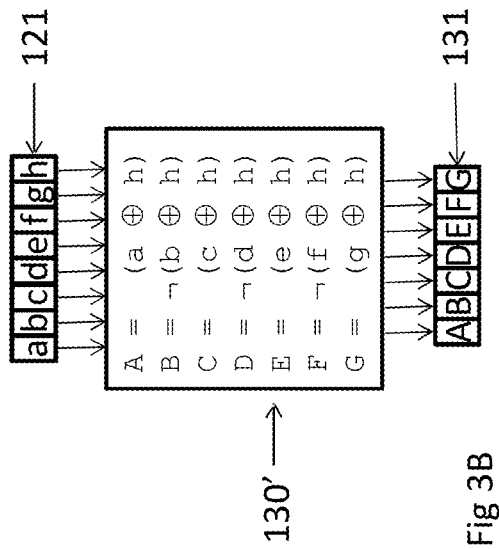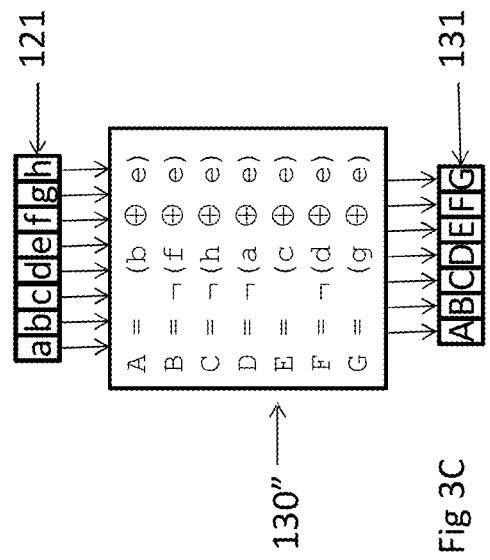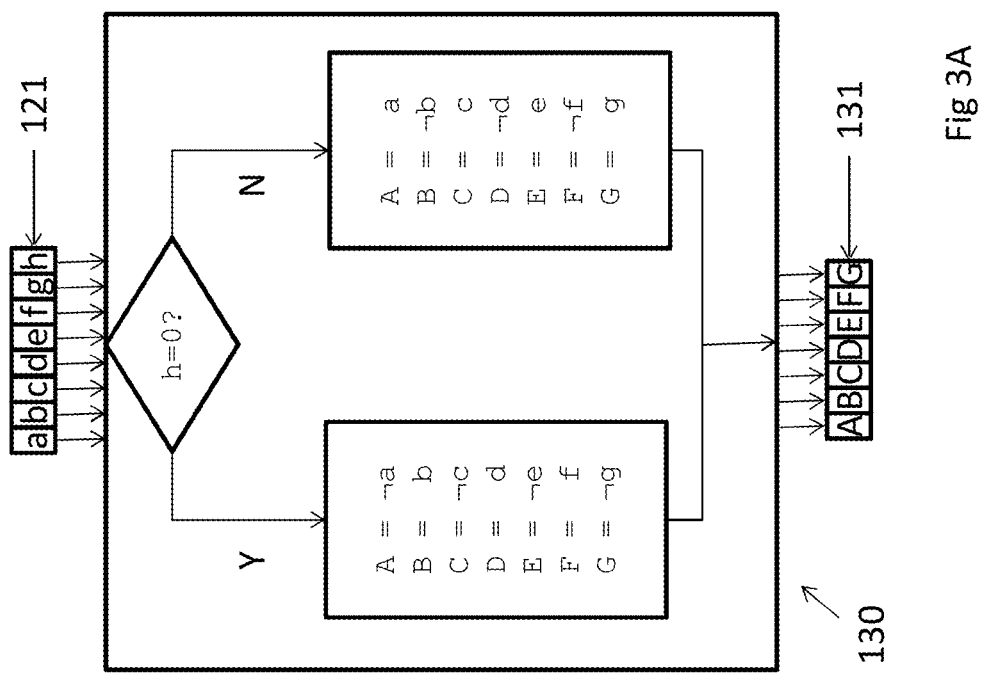

| t | | | | | | | | | | | | | | | | | p | d | c |
|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | | | |
| 1 | 0 | 1 | 1 | 1 | 1 | 1 | 0 | 0 | 1 | 0 | 1 | 0 | 1 | 0 | 1 | 0 | 0 | • | 0 |
| 2 | 1 | 0 | 1 | 0 | 1 | 0 | 1 | 0 | 1 | 0 | 1 | 0 | 1 | 1 | 1 | 0 | 0 | | 1 |
| 3 | 1 | 1 | 0 | 1 | 0 | 1 | 0 | 1 | 0 | 1 | 0 | 1 | 1 | 1 | 0 | 1 | 1 | • | 0 |
| 4 | 0 | 0 | 1 | 0 | 0 | 1 | 1 | 0 | 0 | 1 | 0 | 1 | 0 | 1 | 1 | 0 | 1 | | 1 |
| 5 | 0 | 1 | 1 | 0 | 0 | 1 | 1 | 1 | 0 | 0 | 1 | 0 | 1 | 0 | 1 | 1 | 2 | • | 0 |
| 6 | 0 | 0 | 1 | 1 | 1 | 0 | 1 | 1 | 0 | 1 | 1 | 1 | 0 | 0 | 1 | 1 | 2 | | 1 |
| 7 | 0 | 1 | 0 | 1 | 1 | 0 | 0 | 1 | 1 | 0 | 0 | 0 | 1 | 1 | 0 | 1 | 3 | • | 0 |
| 8 | 1 | 1 | 0 | 0 | 0 | 1 | 1 | 0 | 1 | 1 | 1 | 0 | 0 | 1 | 0 | 1 | 3 | | 1 |
| 9 | 1 | 0 | 1 | 0 | 0 | 1 | 0 | 0 | 0 | 1 | 0 | 0 | 1 | 0 | 1 | 0 | 4 | • | 0 |
| 10 | 0 | 1 | 0 | 1 | 1 | 0 | 0 | 1 | 1 | 0 | 1 | 1 | 0 | 1 | 1 | 1 | 4 | | 1 |
| 11 | 1 | 1 | 0 | 0 | 0 | 1 | 0 | 0 | 0 | 0 | 1 | 1 | 1 | 0 | 0 | 1 | 5 | • | 0 |
| 12 | 0 | 0 | 1 | 1 | 1 | 0 | 0 | 1 | 1 | 1 | 1 | 0 | 1 | 0 | 1 | 1 | 5 | | 1 |
| 13 | 1 | 1 | 1 | 1 | 0 | 1 | 0 | 0 | 0 | 0 | 1 | 1 | 0 | 0 | 0 | 0 | 6 | • | 0 |
| 14 | 0 | 1 | 1 | 0 | 1 | 0 | 1 | 0 | 1 | 1 | 0 | 1 | 1 | 1 | 0 | 1 | 6 | | 1 |
| 15 | 0 | 0 | 1 | 1 | 1 | 1 | 0 | 0 | 0 | 0 | 1 | 1 | 0 | 0 | 0 | 0 | 7 | • | 0 |
| 16 | 1 | 0 | 1 | 1 | 1 | 0 | 0 | 0 | 0 | 1 | 0 | 1 | 1 | 0 | 0 | 0 | 7 | | 1 |
| 17 | 0 | 1 | 1 | 1 | 1 | 1 | 1 | 0 | 1 | 1 | 0 | 1 | 1 | 1 | 0 | 1 | 7 | • | 0 |
| 18 | 1 | 0 | 1 | 1 | 1 | 0 | 0 | 0 | 0 | 0 | 0 | 1 | 1 | 0 | 0 | 0 | 0 | | 0 |
| 19 | 0 | 1 | 1 | 1 | 1 | 1 | 1 | 0 | 1 | 1 | 0 | 1 | 1 | 1 | 0 | 1 | 7 | • | 1 |
| 20 | 1 | 0 | 0 | 1 | 0 | 1 | 0 | 0 | 1 | 1 | 0 | 1 | 0 | 0 | 1 | 0 | 0 | | 0 |
| 21 | 1 | 0 | 0 | 0 | 1 | 1 | 0 | 0 | 0 | 1 | 0 | 1 | 0 | 1 | 0 | 0 | 0 | • | 0 |
| 22 | 1 | 0 | 1 | 0 | 1 | 1 | 0 | 1 | x | x | x | x | 0 | 1 | 0 | 1 | 0 | | 1 |

Fig 4A

| t | 0 | 1 | 2 | 3 | 4 | 5 | 6 | 7 | 8 | 9 | 10 | 11 | 12 | 13 | 14 | 15 | p | D | c |
|---|---|---|---|---|---|---|---|---|---|---|----|----|----|----|----|----|---|---|---|
| 23 | x | x | x | x | 0 | 1 | 0 | x | 1 | 1 | 0 | 0 | a0 | a1 | a2 | a3 | 4 | 1 | 0 |
| 24 | 1 | 1 | 0 | 0 | a0 | a1 | a2 | a3 | a4 | a5 | a6 | a7 | b0 | b1 | b2 | b3 | 4 | 0 | 1 |
| 25 | a4 | a5 | a6 | a7 | b0 | b1 | b2 | b3 | b4 | b5 | b6 | b7 | c0 | c1 | c2 | c3 | 4 | 0 | 2 |
| 26 | b4 | b5 | b6 | b7 | c0 | c1 | c2 | c3 | c4 | c5 | c6 | c7 | d0 | d1 | d2 | d3 | 4 | 0 | 3 |
| 27 | c4 | c5 | c6 | c7 | d0 | d1 | d2 | d3 | d4 | d5 | d6 | d7 | e0 | e1 | e2 | e3 | 4 | 0 | 4 |
| 28 | d4 | d5 | d6 | d7 | e0 | e1 | e2 | e3 | e4 | e5 | e6 | e7 | f0 | f1 | f2 | f3 | 4 | 0 | 5 |
| 29 | e4 | e5 | e6 | e7 | f0 | f1 | f2 | f3 | f4 | f5 | f6 | f7 | g0 | g1 | g2 | g3 | 4 | 0 | 6 |
| 30 | f4 | f5 | f6 | f7 | g0 | g1 | g2 | g3 | g4 | g5 | g6 | g7 | 0 | 1 | 0 | 1 | 4 | 0 | 7 |
| 31 | g4 | g5 | g6 | g7 | 0 | 1 | 0 | 1 | 1 | 1 | 0 | 0 | h0 | h1 | h2 | h3 | 4 | 1 | 0 |
| 32 | 1 | 1 | 0 | 0 | h0 | h1 | h2 | h3 | h4 | h5 | h6 | h7 | i0 | i1 | i2 | i3 | 4 | 0 | 1 |
| 33 | h4 | h5 | h6 | h7 | i0 | i1 | i2 | i3 | i4 | i5 | i6 | i7 | j0 | j1 | j2 | j3 | 4 | 0 | 2 |
| 34 | i4 | i5 | i6 | i7 | j0 | j1 | j2 | j3 | j4 | j5 | j6 | j7 | k0 | k1 | k2 | k3 | 4 | 0 | 3 |
| 35 | j4 | j5 | j6 | j7 | k0 | k1 | k2 | k3 | k4 | k5 | k6 | k7 | l0 | l1 | l2 | l3 | 4 | 0 | 4 |
| 36 | k4 | k5 | k6 | k7 | l0 | l1 | l2 | l3 | l4 | l5 | l6 | l7 | m0 | m1 | m2 | m3 | 4 | 0 | 5 |
| 37 | l4 | l5 | l6 | l7 | m0 | m1 | m2 | m3 | m4 | m5 | m6 | m7 | m 0 | m 1 | m 2 | m 3 | 4 | 0 | 6 |
| 38 | m 4 | m 5 | m 6 | m 7 | n0 | n1 | n2 | n3 | n4 | n5 | n6 | n7 | n0 | n1 | n2 | n3 | 4 | 0 | 7 |
| 39 | n4 | n5 | n6 | n7 | 0 | 1 | 0 | 0 | 1 | 1 | 1 | 0 | o0 | o1 | o2 | o3 | 4 | 0 | 0 |
| 40 | 1 | 1 | 0 | 0 | x | x | x | x | x | x | x | x | x | x | x | x | 4 | 0 | 1 |
| 41 | x | x | x | x | 1 | 0 | 1 | 1 | 0 | 1 | 0 | 1 | 1 | 1 | 1 | 0 | 4 | 0 | 2 |
| 42 | 0 | 1 | 0 | 1 | 1 | 1 | 0 | 0 | x | x | x | x | x | x | x | x | 0 | 1 | 0 |

Fig 4B

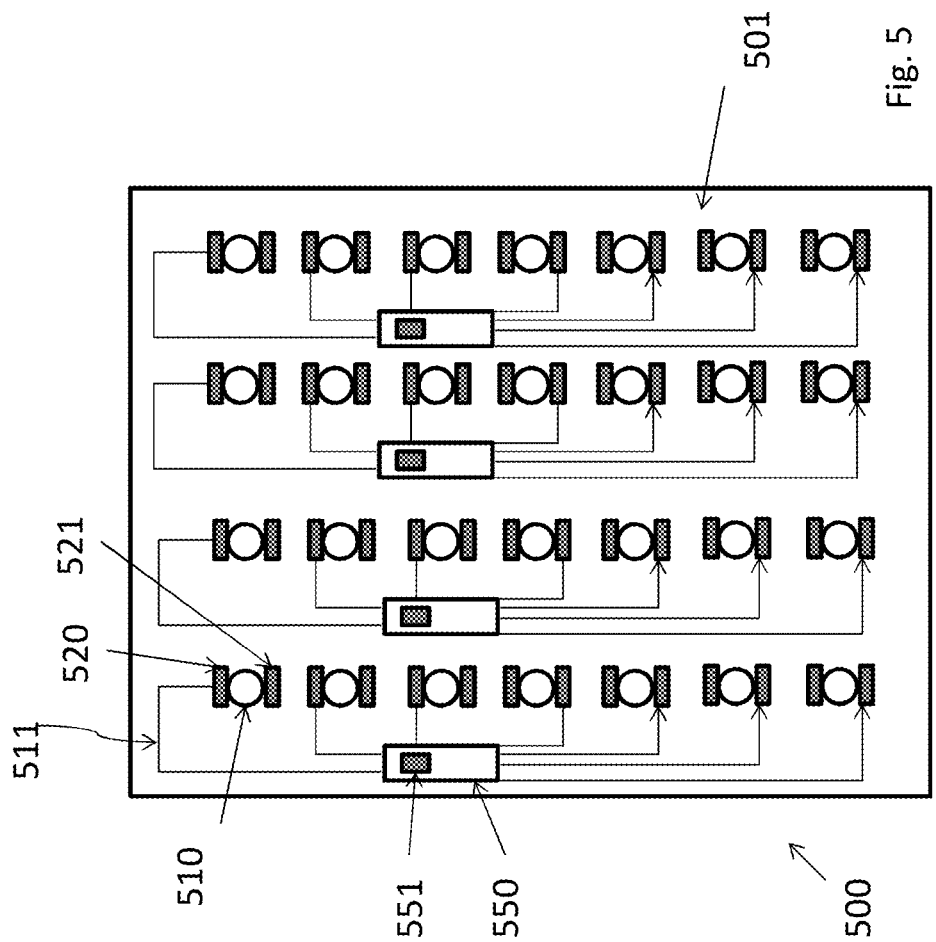

METHOD AND DEVICE FOR GENERATING A DECODED AND SYNCHRONIZED OUTPUT

BACKGROUND

The present invention relates to a method and device for generating a decoded and synchronized output of m-bit pattern words from an input bit-stream comprising frames with corresponding n-bit pattern symbols as well as a n-bit comma symbol and in which bit-skip may have occurred, with m<n.

The invention further relates to a multi-beam lithography system comprising such a decoding device, and to a beam modulator array comprising such a decoding device.

Decoding of n-bit pattern symbols to m-bit pattern words, with m<n, is known, for instance from 8B/10B symbol mapping in which a number of consecutive 8-bit pattern words are mapped into a bit-stream of 10-bit encoded pattern symbols and vice versa. European Patent no EP 97 763 describes an implementation of 8B/10B mapping in which the redundancy provided by extending m bits to n bits is used to define at least one comma symbol which has a unique bit pattern that does not occur in any two consecutive symbol mappings for the pattern words. In this comma-based implementation, a number of m-bit patterns are encoded into a data frame which comprises a corresponding number of encoded n-bit symbols which map the m-bit pattern words, as well as a comma symbol to signify the start or end of the frame. A transmitter transmits the thus encoded data frames as a data stream to a receiver which decodes the received data stream by using decode-tables.

A drawback of this known implementation is that decoding of the data frame requires considerable amounts of logic, and thus space, at the decoder side, e.g. for hardwired lookup-tables and/or complex decode functions. If synchronization is to take place at the receiver as well then additional resources are required. Such resources are generally scarce at a decoder, in particular if the decoder is part of a beam modulator array of a multi-beam lithography system which is adapted for individually blanking beams of a plurality (e.g. tens of thousands, hundreds of thousands or more) of beamlets, as any space taken up by circuitries of the decoder cannot be used by modulators or the modulator array or by apertures in the beam modulator array for letting through the beamlets.

It is an object of the present invention to provide a method and decoding device which substantially overcomes this drawback. Further objects are to provide a multi-beam lithography system comprising such a decoder, as well as a beam modulator array comprising such a decoder.

SUMMARY OF THE INVENTION

To this end, according to a first aspect, the present invention provides a method of generating a decoded and synchronized output of m-bit pattern words from an input bit-stream comprising frames with n-bit pattern symbols as well as an n-bit comma symbol and in which bit-skip may have occurred, with m<n, said method comprising repeating the steps of:

a) receiving a sequence of q bits from the input bit-stream, with $q \geq 1$;

b) detecting whether a predetermined n-bit comma symbol is present in a concatenation of all but the last bit of the received sequence of q bits appended to a sequence of n bits received from the input bit-stream immediately prior thereto;

c) determining a comma position, wherein if in step b) a comma symbol is detected, said comma position is determined to be indicative of a position at which the comma symbol was detected in said concatenation, and wherein otherwise said comma position is determined as a comma position that was most recently determined in step c);

d) if in step b) no comma symbol was detected:
  selecting a predetermined number of bits of the concatenation starting from the position indicated by the comma position, and decoding said selected predetermined number of bits to generate at least one decoded m-bit pattern based only on said selected bits, and outputting said at least one decoded m-bit pattern word.

The method provides a particularly simple manner for providing a decoded and synchronized output from an input bit-stream in which bit skip may have occurred. Bit skip may occur for instance between transmission of the input bit-stream and receipt thereof for decoding, causing synchronization errors when a number of bits has not been sent, or skipped, during transmission. Herein, an output is considered to be synchronized if during generation of the output it is known which n bits of a received sequence of n-bits appended to an sequence of n-bits received immediately prior thereto are to be selected and decoded to generate a decoded m-bit pattern word. The present method synchronizes the input bit-stream whenever a comma symbol is received and the synchronization is effected almost instantaneously, i.e. before two additional n-bit symbols are received from the input bit-stream.

Propagation of one or multiple bit-skip errors is limited until the next time a comma symbol is detected in the received input bit-stream. Preferably the value of the comma position initially is set to the initial zero, but may alternatively be set to zero by ensuring that the first symbols in the bit-stream are comma symbols.

The method only outputs a decoded m-bit pattern word when no comma symbol is detected, in this manner preventing decoded comma symbols from being decoded and output. As for the comma detection the last bit of the most recently received n-bits is ignored, it is possible that a decoded pattern word is output even if the most recently received sequence of n bits contains a comma symbol. A decoded m-bit pattern word is however not necessarily output for each received n-bit sequence, e.g. if the input bit-stream contains only n-bit sequences which correspond to comma symbols, then no decoded m-bit pattern words will be output.

Though not essential, in general a received input bit-stream may be expected to comprise a series of frames, each frame comprising a predetermined number of n-bit symbols including a sequence of consecutive n-bit pattern symbols as well as an n-bit comma symbol. This predetermined number of symbols in each frame may also be referred to as the frame symbol count. Though for such an input bit-stream a comma symbol will typically be received for every frame, it may occasionally occur that a comma symbol is distorted during transmission a comma symbol, for instance due to one or more bit-flip and/or bit-skip errors occurring during transmission of the comma symbol. Such a distorted comma symbol would not be detected as a comma symbol and would therefore result in the distorted comma symbol being decoded and subsequently output.

In an embodiment q is equal to n and said predetermined number of bits equals n as well. In this embodiment, during outputting said at least one decoded m-bit pattern word preferably only one decoded m-bit pattern word is output.

In an embodiment, the method further comprises updating a symbol counter indicative of a number of consecutive n-bit pattern words that have been output without outputting a comma symbol, said updating comprising, each time a new sequence of n-bits is received from the input stream:

if in step b) said comma symbol was detected or if the value of the symbol counter indicates that a number of consecutive pattern symbols has been output that is greater than or equal to a predetermined frame symbol count, setting said symbol counter to an initial value, and otherwise incrementing the symbol counter;

wherein in step d) outputting said decoded m-bit pattern only occurs if said pattern symbol counter has a value different than said initial value. In this embodiment, even if a bit-flip or bit-skip error has occurred during transmission of a comma symbol so that instead a distorted comma symbol is received, decoding and outputting of the resulting distorted comma symbol may be avoided. In the case that the distortion of a comma symbol is caused only by bit-skip errors, this embodiment will result in no errors in the output bitstream. The initial value of the symbol counter will typically be zero.

In an embodiment in step c) said determining of the comma position to be indicative of a position at which the comma symbol was detected in said concatenation, comprises determining the comma position to be indicative of a position of a last occurrence of the comma symbol in the concatenation when starting from the first bit of the concatenation. In principle, the concatenation should contain at most one occurrence of a comma symbol. However, due to errors during transmission or even during encoding, it can happen that two such comma symbols are present in the concatenation. For instance, if a comma symbol is "0101 1100" and a first n-bit sequence of "0101 1100" is received immediately after which a second n-bit sequence of "1011 1001" is received, then the resulting concatenation of all but the last bit of the second sequence appended to the first sequence is: "0101 1100 1011 1001". This concatenation has comma symbols starting at positions 0 and 7 as can be seen more easily from the table below:

| bit position in concatenation | 1 0123 4567 8901 2345 |
|---|---|
| bit value | 0101 1100 1011 1001 |

The present embodiment helps avoid two synchronizations in a row by detecting only the last occurrence of the comma symbol in the concatenation.

In an embodiment each n-bit pattern symbol comprises an encoded m-bit pattern word as well as decode information for decoding said encoded m-bit pattern word, wherein, when said selected n bits of the concatenation contain an n-bit pattern symbol, decoding of said n-bits to generate the decoded m-bit pattern word comprises:

inverting all of the m bits of the encoded m-bit pattern word or not, based on the decode information, to produce a partially decoded m-bit pattern word; and inverting bits at three or more predetermined bit positions of the partially decoded m-bit pattern word to generate the decoded m-bit pattern word.

This way of generating a decoded m-bit pattern word based only on the n bits of the concatenation starting from the position indicated by the comma position is particularly simple and requires only a minimum of space and/or computational resources to be carried out. For example, if the selected n bits are equal to "1111 0111", with the last bit thereof being the decode information, wherein when the decode information is "1" all remaining m-bits are to be inverted, and if the predetermined pattern positions are the even positions in the selected n-bits, then the corresponding m-bit pattern word is generated by inverting "1111 011", resulting in "0000 100", and subsequently inverting the even bits thereof, resulting in "1010 001". As m<n it is possible that decoding another n-bit pattern symbol results in the same decoded m-bit pattern word. For instance, if the selected n bits contain an n-bit pattern symbol of "0000 1000", then the decode information in the last bit thereof indicates that all remaining m-bits "0000 100" do not have to be inverted before inverting the even bits thereof, also resulting in a decoded m-bit pattern word of "1010 001".

In an embodiment the method further comprises outputting a resync signal in case in step b) a comma symbol is detected and the value of the comma position during said step b) is unequal to the value of the comma position determined subsequently in step c). The resync signal, which is preferably output to a different output than the decoded m-bit pattern words, is thus generated when a comma symbol is detected at an unexpected moment, indicating that a resynchronization of the output has occurred. For example, if a comma position corresponds to a position in the selected n-bits where the comma is or was detected, then a comma symbol may be detected in step b) while the comma position has a value 3, and subsequently in step c) the comma position may be determined to have a different value, e.g. 2. This would result in a change the starting position in the concatenation from which the n-bits on which the decoding is based is selected, and thus would also result in resynchronization of subsequently output decoded m-bit pattern words. The resync signals may for instance be output to a monitoring device for monitoring a ratio of resync signals to decoded pattern words, so that errors in the input bit-stream can be monitored or logged and/or so that transmission of the input bit-stream can be halted or paused if this ratio exceeds an resync threshold.

In an embodiment said method further comprises outputting a resync signal in case in step b) a comma symbol is detected and the value of the symbol counter does not correspond with said predetermined frame symbol count. For instance, if the predetermined frame symbol count equals 8, then each frame of 8 n-bit symbols should contain one comma symbol. Detection of a comma symbol when the symbol counter has a value different than 8 means that either too few or too many consecutive n-bit pattern symbols have been output without receiving a comma symbol, resulting in the resync signal being output, e.g. to a monitoring device as described above. If the value of the symbol counter exceeds the frame symbol count, then according to step b) the symbol counter is set to the initial value, which may be done after the resync signal has been output.

In an embodiment the method further comprises outputting a missed comma signal in case in step b) no comma symbol is detected and the symbol counter is set to the initial value. Again, assuming that the predetermined frame symbol count equals 8, then each frame of 8 n-bit symbols should contain one comma symbol. However, if a comma symbol is distorted by one or more bit-flips during transmission, then no comma symbol will be detected, even though in view of the value of the symbol count a comma symbol is expected. In this situation the method outputs the missed comma signal, preferably to a different output than to which the decoded m-bit pattern words are outputs, such as to a monitoring device as described above.

In an embodiment the input bit-stream comprises frames of pattern symbols, wherein said pattern symbols in each frame are non-multiplexed. Thus, when receiving bits from the input bit-stream, demultiplexing these bits is not required.

In an alternative embodiment said input bit-stream is a multiplexed input bit-stream and the method further comprises demultiplexing said bits received from said input bit stream prior to outputting said at least one decoded m-bit pattern word. For instance, a frame comprising a number n-bit pattern symbols in the input bit-stream may first contain all first bits of the n-bit pattern symbols, followed by all second bits of the n-bit pattern symbols and so on, or may be multiplexed in another manner as will be apparent to the skilled person.

The demultiplexing can be performed at any step of the method as long as it is before the at least one decoded m-bit pattern word is output. For instance, the demultiplexing may be performed immediately after receiving the q bits in step a) and prior to step b) so that the concatenation is always a concatenation of demultiplexed bits received from the input bit-stream. Alternatively, demultiplexing may be carried out immediately after step b) such that the concatenation in which a comma symbol may be determined is a demultiplexed concatenation. Another possibility is that demultiplexing is performed in step d) prior to decoding the predetermined number of bits, so that during decoding demultiplexed bits are decoded. Yet another possibility is that demultiplexing is carried out after step d) but prior to outputting the at least one decoded m-bit pattern word. Many other possibilities for demultiplexing will be apparent to the skilled person.

In an embodiment, the concatenation has a bit length of at least n−1+q bits, so that detection of an n-bit comma symbol in the concatenation is possible. For instance, if q=4, i.e. the data width equals 4 such that 4 bits are received from the input bit-stream at a time, and if n=8, then the concatenation has to contain at least 8−1+4=11 bits. The following table provides some examples of the minimum bit size the concatenation must have in order to be able to check for a comma symbol therein, assuming that n=8:

| Data width (q) | minimum size of concatenation = n − 1 + q, with n = 8 |
| --- | --- |
| 1 | 8 − 1 + 1 = 8 |
| 2 | 8 − 1 + 2 = 9 |
| 4 | 8 − 1 + 4 = 11 |
| 8 | 8 − 1 + 8 = 15 |
| 16 | 8 − 1 + 16 = 23 |
| 32 | 8 − 1 + 32 = 39 |
| 64 | 8 − 1 + 64 = 71 |

According to a second aspect the present invention provides a decoding device configured to generate a decoded and synchronized output of m-bit pattern words from an input bit-stream comprising frames with n-bit pattern words as well as an n-bit comma symbol and in which bit-skip may have occurred, with m<n, said decoding device comprising:

a memory for storing a sequence of q bits received from the input bit-stream, with q≥1;

comma detection circuitry adapted for generating a comma detect signal only if a comma symbol is detected in a concatenation of all but the last bit of the received sequence of q bits appended to a sequence of n bits received from the input bit-stream immediately prior thereto, and for generating a comma position signal such that said comma position signal does not change its value if no comma symbol is detected and otherwise is set to a value indicating a position in said concatenation at which said comma symbol is detected;

decoding circuitry connected to said comma detection circuitry and adapted for selecting n bits of the concatenation starting from the position indicated by the comma position signal, and for generating a decoded m-bit pattern-word based only on said selected n bits;

output circuitry connected to said decoding circuitry and adapted for outputting said at least one decoded m-bit pattern word when no comma detect signal is generated.

Herein, an n-bit symbol or portion thereof that is received at the decoding device is said to be synchronized if it is clear at the decoding device what the start and end position of an n-bit symbol in the memory of the decoding device are. The present invention provides a decoding device adapted for synchronizing an input bit-stream in which bit-skip may have occurred, wherein synchronization is started whenever a comma symbol is received. Synchronization may thus be effected almost instantaneously, e.g. before two additional n-bit symbols are received from the input bit-stream, and propagation of one or multiple bit-skip errors is limited until the next time a comma symbol is found in the input bit-stream. The comma position signal preferably initially has a value of zero, but may alternatively be set to zero by transmitting one or more comma symbols to the decoding device.

Decoding of non-comma n-bit symbols in the input bit-stream is based only on the selected n-bits and is carried out independent of the contents of earlier non-comma pattern symbols. This allows the decoding device to have an especially simple construction as, besides the memory and the value of the comma position signal, no further memory is required for the decoding device to function. Complex look-up tables and/or logic for decoding the input bit-stream as known for instance from EP 97 763 can be omitted. The value of the comma position signal may be stored in a separate memory of $\log_2(n)$ bits.

The decoding device can easily be produced as an integrated circuit, in particular as a compact integrated circuit having small space requirements and few logic gates. The decoding device can also be integrated in a beam modulator array for a multi-beam lithography system.

Whenever a comma symbol is detected at any position in the concatenation, the comma position signal is set to the position in the concatenation where the comma symbol was detected and a comma detect signal is generated. If no comma bit sequence is detected, then the value of the comma position signal remains the same until the next comma symbol is detected.

The output circuitry is adapted for only outputting a decoded m-bit pattern word when no comma detect signal is generated, so that decoded comma symbols are prevented from being output by the output circuitry. Preferably, n=m+1, preferably with m being greater than or equal to 7.

As m<n more n-bit symbols than m-bit pattern words will exist. Thus for each of a plurality of possible pattern words, two or more different n-bit pattern symbols may exist which, when received by the decoding device, are decoded to a same m-bit pattern word. At an encoder side the mapping of pattern words to symbol words in the output bit-stream is preferably chosen such that the resulting bit-stream which is transmitted to the decoding device has favorable properties, e.g. is substantially DC (direct current) balanced, has a low CID (consecutive identical digit) count and/or is guaranteed not to contain one or more "false comma's", i.e. bit sequences which correspond to a comma symbol but which were not intentionally inserted into the bit-stream to provide a synchronization point or delimit a frame.

In order to be able to store a sequence of q bits, the memory may comprise, or consist of, q bits. Preferably however, the memory comprises, or consists of n−1+q bits. For example, if n=q=8 then the memory may consist of 15 bits, allowing detection of a comma symbol in the memory starting at any of bit 0 . . . 7 of the memory.

In an embodiment wherein said memory is adapted for storing, together with the received sequence of q bits, the sequence of n bits that was received from the input bit-stream immediately prior thereto. The memory may thus form a first-in first-out queue for a number of q-bit sequences received from the input bit-stream. E.g., if n=q and the memory is arranged for storing bits at positions 0 through 2n−1, then upon receipt of a new n-bit sequence from the input bit-stream, the bits at locations n through (2*n−1) in the memory may be copied to locations 0 through n−1, and the most recently received n-bit symbol may be copied to locations n through 2*n−1.

In an embodiment the decoding device is formed as an integrated component, preferably, wherein the decoding device is provided on a semiconductor material, such as silicon, by means of a lithographic process.

In an embodiment the comma detection circuitry is adapted for, when the comma detected signal is generated, generating the comma position signal such that it indicates the position of a last occurrence of the comma symbol in the concatenation when starting from the first bit of the concatenation. In case the concatenation contains more than one comma symbol, multiple synchronizations in a row are thus prevented.

In an embodiment said decoding device further comprises symbol counter circuitry connected to the comma detection circuitry and adapted for, each time a new sequence of n-bits is received from the input bit-stream, setting a symbol counter to an initial value if the comma detect signal is generated or if the current value of the symbol counter is equal to a predetermined frame symbol count, and otherwise increasing the symbol counter; wherein said output circuitry is adapted for only outputting said decoded m-bit pattern word when said symbol counter has a value different than the initial value. In case a comma symbol has been distorted during transmission to the decoding device, output of the distorted comma symbol may thus be prevented.

In an embodiment the decoding device further comprises: a resync detection circuitry adapted for outputting a resync-signal in case a comma detect signal is generated together with a comma position signal which has a value unequal to a value of the comma position signal that was generated immediately prior thereto; and an interface for coupling with an external device for outputting the resync-signal to the external device. A change in the value of the comma position signal is indicative of a resynchronization of the input bit-stream. The present embodiment allows the external device to monitor the number of times such a change in value of the comma position signal occurs. The external device, for instance a processing unit of a computer, may be adapted for storing the number of resync-signals, and/or for alerting an operator in case a ratio of number of resync-signals per number of output pattern words exceeds a predetermined resync-threshold. Preferably, the resync signal comprises the value of the symbol counter immediately prior to said setting said symbol counter to its initial value.

In an embodiment the resync detection circuitry is further adapted for outputting a resync signal to the external device in case a comma detected signal is generated and a value of the symbol counter does not correspond with the predetermined frame symbol count. If a comma is detected when the symbol counter that does not correspond with the predetermined frame symbol count then the comma is detected at an unexpected position in the input bit-stream. In such a case the present embodiment outputs a resync signal to the external interface.

In an embodiment the decoding device further comprises a missed comma detection circuitry adapted for outputting a missed comma signal when the value of the symbol counter is being set to the initial value without a comma detect signal being generated; wherein said decoding device is provided with an interface for coupling with an external device for transmitting the missed comma signal to the external device. The external device will typically be the same external device to which the resync-signals may be output, but may alternatively be a different external device such as another processing unit of the or another computer, and is preferably adapted for monitoring a number of missed-comma signals that are received from the decoding device.

In an embodiment said selected n bits comprise an encoded m-bit pattern word as well as decode information for decoding said encoded m-bit pattern word, wherein said decode circuitry is adapted for, depending on the decode information, generating the decoded m-bit pattern word as either:—the bits of the encoded m-bit pattern word in which bits at three or more predetermined bit-positions are inverted; or—the bits of the encoded m-bit pattern word in which all bits other than those at the three or more predetermined bit-positions are inverted. Such a simple decoding circuitry also requires little space and/or computational resources on the decoding device.

In an embodiment wherein said selected sequence comprises a polarity bit, and wherein said decoding circuitry is adapted for generating said decoded m-bit pattern word by XOR-ing bits at two or more predetermined positions in said selected sequence with said polarity bit, preferably wherein the number of predetermined positions is less than or equal to (m/2)+1.

In an embodiment said decoding circuitry is adapted for generating each bit of said decoded m-bit pattern word in parallel.

In an embodiment the decoding circuitry comprises logic gates selected from the group of NAND, AND, NOR, XOR, XNOR and/or OR logic gates, wherein the total number of logic gates of said decoding circuitry for generating a decoded m-bit pattern word from the selected n bits is less than or equal to 3*n, preferably less than or equal to 3*m.

In an embodiment the decoding device further comprises demultiplexing circuitry for demultiplexing said bits received from said input bit stream prior to outputting said at least one decoded m-bit pattern word.

According to a third aspect, the present invention provides a decoding device adapted for carrying out the method as described herein.

According to a fourth aspect, the present invention provides a beam modulator array comprising one or more decoding devices as described herein, and further comprising an array of modulators for individually modulating a plurality of beamlets, wherein each of said one or more decoding devices is electrically coupled to a corresponding plurality of modulators of said array of modulators for controlling said plurality of modulators. As the decoding devices are of a simple construction each of these can be located relatively close to its corresponding plurality of modulators and electrical wires between each decoding device and its modulators can be kept short to minimize electrical interference between such wires.

Preferably the one or more decoding device and the array of modulators together form an integrated component, e.g. the decoding devices and their modulators may be provided on a semiconductor material, such as silicon, by means of a lithographic process. Moreover, the simplicity of the decoding devices allows construction of a beam modulator array containing many of these, e.g. thousands, tens of thousands or more, while at the same time leaving sufficient space for the array of array modulators for individually modulating large amounts (e.g. tens of thousands to hundreds of thousand or more) of beamlets.

In an embodiment the modulators of said array of modulators are arranged substantially within a single plane, and wherein each of said decoding devices is arranged within an area spanned by its corresponding plurality of modulators. The decoding devices are thus arranged between the modulators, and typically within a space spanned by beamlets that are directed towards the beam modulator array. The modulators are preferably arranged within the plane at equidistant points.

In an embodiment said beam modulator array further comprises light sensitive elements, wherein each of said decoding devices is connected to one of said light sensitive elements, and wherein each of said light sensitive elements is arranged for receiving a modulated light beam and converting said modulated light beam to an electrical signal comprising the input bit-stream for one or more of said decoding devices. Instead of using electrical signals, the input bit-stream for the decoding device can thus be transmitted to the beam modulator array using light beams, which may further reduce electrical interference at the beam modulator array.

In an embodiment each decoding device is arranged within a predetermined distance to each of the modulators coupled thereto, wherein said predetermined distance is less than or equal to 20 times a maximum distance between two neighboring modulators coupled to said decoding device, preferably less than 10 times said maximum distance. The length of electrical wires between each modulator and its decoding device may thus be kept short, reducing electrical cross-talk on the beam modulator array. For instance, if the modulators are arranged at a pitch (center-to-center distance) of 50 nm, then the corresponding decoding device is arranged no farther than 1000 nm from each of the modulators coupled thereto.

In an embodiment the modulators of the array of modulators comprise electrostatic and/or magnetic deflectors for deflecting a charged particle beamlet of a plurality of beamlets. For instance, depending on whether a beamlet is deflected by a modulator of the array, the beamlet may or may not pass through a beam stop array that is arranged downstream of the modulator. The beam modulator array is thus adapted for individually modulating charged particle beamlets of the plurality of beamlets.

According to a fifth aspect the present invention provides a multi-beam lithography system for patterning a target, said system comprising: a beam source for generating a plurality of beamlets for patterning said target; a beam modulator array as described herein and arranged for receiving bit-streams as input bit-streams for the one or more decoding devices of said beam modulator array. In such a lithography system, which may be a charged particle multi-beam lithography system or a light-based multi-beam lithography system, synchronization of data received at the beam modulator array advantageously takes place at the beam modulator array.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIGS. 4A and 4B show an example of the contents of a memory of a decoding device according to the present invention and values for signals generated by the decoding device as a input bit-stream is being decoded, FIG. 5 schematically shows a beam modulator array according to the invention, FIGS. 6A and 6B each show a flowchart of a method according to the present invention, FIGS. 7A and 7B respectively show schematically portions of embodiments of a decoding device for decoding a input bit-stream and adapted for receiving 4 bits and 1 bit at a time respectively, with n=8.

DETAILED DESCRIPTION OF THE INVENTION

Figure 1:
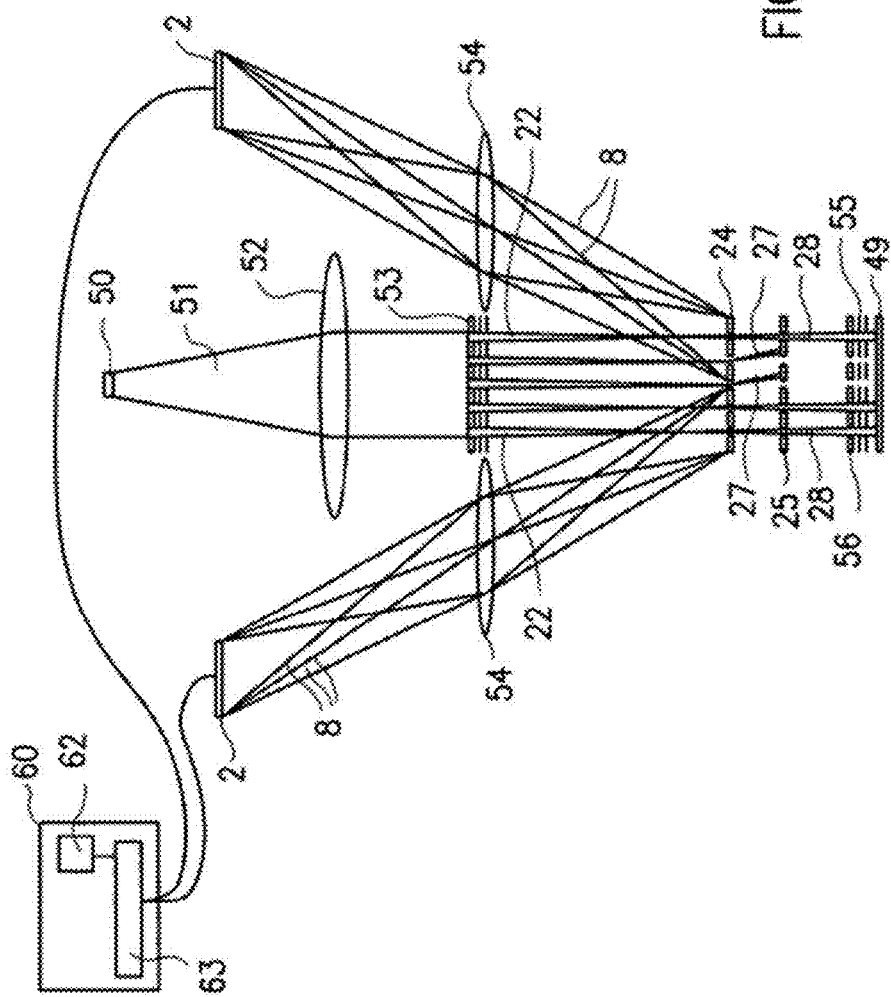
FIG. 1 schematically shown a multi beam lithography system according to the present invention, FIGS. 2A, 2B and 2C schematically show embodiments of a decoding device according to the present invention, FIGS. 3A, 3B and 3C each schematically show a decoding circuitry as may be used in a decoding device according to the present invention.

FIG. 1 shows a multi-beam lithography system for patterning a target 49 according to the present invention. The system comprises a beam source 50, e.g. a charged particle source or a light source, for generating a diverging beam 51. The system further comprises a collimator 52 for collimating the beam into a substantially parallel beam. The substantially parallel beam impinges on a beam splitter 53, which splits the beam 51 up into a plurality of beamlets 22. Though not shown in FIG. 1 for reasons of clarity, the plurality of beamlets typically comprises tens of thousands to hundreds of thousands or more beamlets. Downstream of the beam splitter 53 a beam modulator array 24, sometimes denotes beam blanker array, for individually blanking beamlets of the plurality of beamlets. A beamlet is said to be blanked if it does not reach the target 49, which in this case is a wafer. In the present example, beamlets 27 have been modulated by the beam modulator array 24 to be deflected from their original path such that beam stop array 25 stops these beams from reaching the target 49, whereas beamlets 28 remain undeflected and proceed to be projected, by means of projection optics 56, onto the target 49. This manner of blanking is particularly advantageous if the multi-beam lithography system is a charged particle multi-beam lithography system. It will be obvious to the skilled person that when the lithography system is a light-based multi-beam lithography system another kind of suitable beam modulator array may be used instead.

The lithography system further comprises a pattern streamer 60, for streaming pattern data to beam modulator array 24, and comprising a memory 62 for storing a sequence of m-bit pattern words representative of the pattern that is to be written onto the target 49, as well as an encoding device for encoding the pattern words as frames comprising n-bit pattern symbols as well as an n-bit comma symbol. The frames encoded by the encoding device 63 are transmitted to two light beam emitters 2 which convert the encoded frames into pattern data carrying light beams 8. The pattern data carrying light beams are projected, via lenses 54, onto the beam modulator array 24. Based on the pattern symbols in the received frames, the beam modulator array 24 individually blanks beamlets of plurality of beamlets 22.

Substantially more space and computational resources are available for the pattern streamer 60 and/or encoding device 63 than for the beam modulator array 24. By using a beam blanker array according to the present invention, which comprises decoding devices as described herein, the pattern symbols can be decoded as well as synchronized at the beam modulator array using relatively very little space and few computational resources in comparison.

Figure 2A:
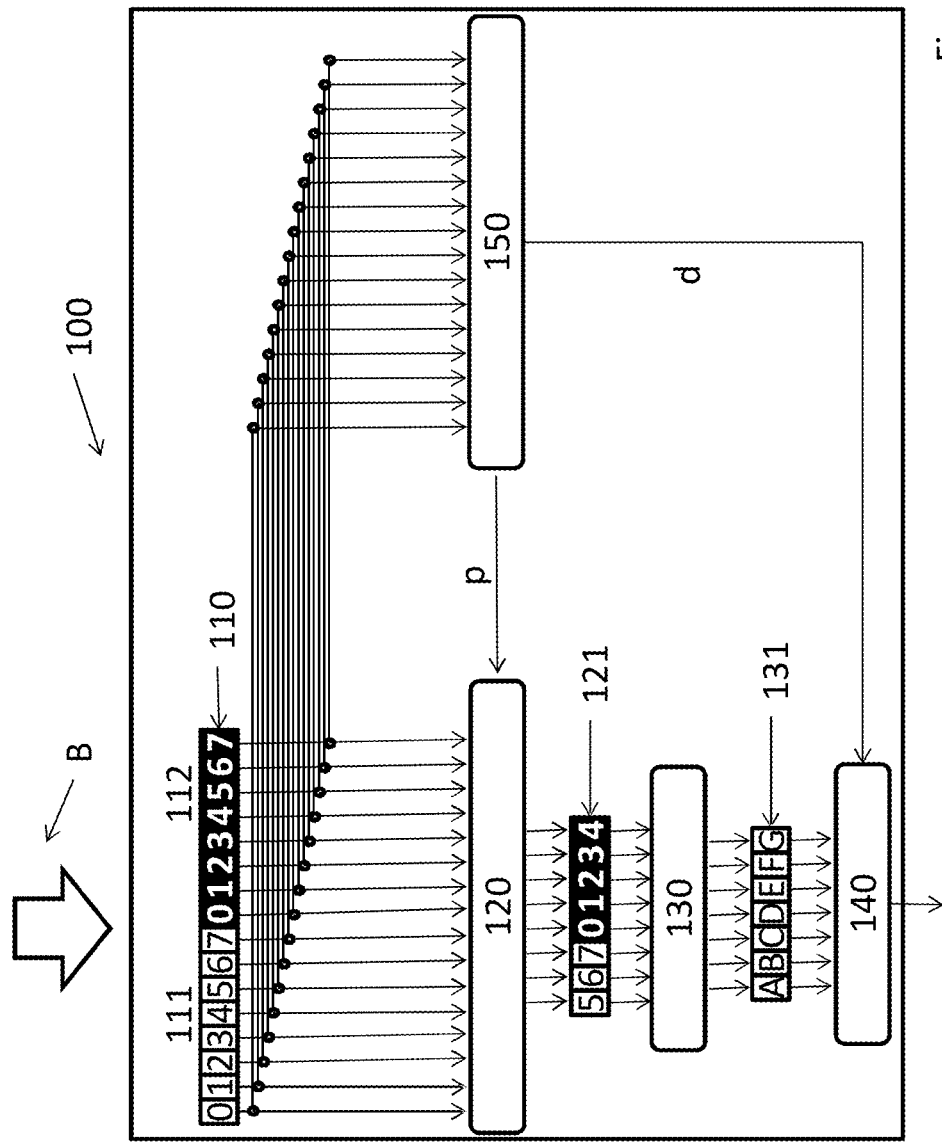

FIG. 2A schematically shows a decoding device 100 according to the present invention, configured for decoding n-bit pattern symbols and for outputting the decoded pattern symbols as m-bit pattern words, wherein m<n. In the embodiment shown n=8 and m=7, i.e. the decoding device 100 is adapted for decoding 8-bit pattern symbols and outputting these as 7-bit pattern words. However, in an alternative embodiment the decoding device may be adapted to decode pattern symbols having another bit-length and to output pattern words having another bit-length, as long as 2<m<n.

The decoding device, or decoder, is configured for receiving an input bit-stream B which comprises frames with n-bit pattern symbols as well as an n-bit comma symbol. For receiving the n-bit pattern words, the decoding device is provided with a memory 110 comprising a first memory section 111 and a second memory section 112, for storing n-bits each. The memory 110 has 2*n bits in total, with the first memory section 111 having bits 0 . . . n−1 which correspond to bits 0 . . . n−1 of the memory, and the second memory section 112 containing bits 0 . . . n−1 which correspond to bits n . . . 2n−1 of the memory 110. Each time a sequence of n-bits is received by the decoding device the contents of the second memory section 112 is copied to the first memory section 111, and the newly received n-bits are stored in the second memory section. The memory 110 is thus stores a concatenation of a first sequence of n-bits and a directly consecutive second sequence of n-bits received from the input bit-stream B, wherein the second sequence is appended to the first sequence.

If transmission of the input bit-stream to the decoding device occurs without any errors then the bits of the n-bit sequences received will be aligned with the memory 110, in particular with the first and second memory sections 111, 112 thereof. That is, the first sequence will be stored in bits 0 . . . n−1 of first memory section 111, and the second sequence will be stored in bits 0 . . . n−1 of the second memory section 112, so that the first sequence and second sequence appended to the first sequence will be stored in bits 0 . . . 2−1 of the memory 110.

If however during transmission of the bit-stream to the decoding device one or more bits are lost or skipped then the bits that are received at the decoding device will likely be misaligned with respect to memory 110, resulting in loss of synchronization. If an n-bit symbol that is received at the decoding device is not synchronized, i.e. if it is not clear at the decoding device where the n-bit symbol starts and ends, then in general the symbol will not be decoded correctly. Synchronization errors propagate until synchronization, which typically occurs when a comma symbol bit-sequence is detected in the received input bit-stream.

In order to detect a comma symbol in the bit-stream B the decoding is provided with comma detection circuitry 150 which is connected to the memory 110, or at least to bits 0 . . . 2-2 of the memory. The comma detection circuitry generates a comma detect signal "d" if a bit sequence corresponding to the comma symbol is present in all but the last bit the memory 110. Checking whether the last bit, i.e. bit 2n−1, of the memory is part of a comma symbol is omitted, as a comma symbol having its last bit at position 2n−1 of the memory will be recognized when a subsequent n-bit symbol is received and the contents of the second memory section 112 are copied to the first memory section 111.

The comma detection circuitry 150 also generates a comma position signal "p". In case a comma symbol is detected the comma position signal is generated to indicate the position of the last occurrence of the comma symbol in the memory 110 starting from bit 0 of the memory 110. If no comma symbol is detected then the generated comma position signal does not change in value but maintains the value it had when the directly preceding n-bit sequence was received.

A selector circuitry 120 receives the comma position signal p and is adapted for selecting a sequence of n bits of the memory 110 starting from the position indicated by the comma position signal p. In the example shown, the comma position signal p has a value of 5, resulting in bits 5 . . . 7 of the first memory section 111 being selected and bits 0 . . . 4 of the second memory section 112 being selected, resulting in a total of n=8 bits being selected which correspond to bits 5 . . . 12 of the memory 110.

The decoding device further comprises a decoding circuitry 130, which, based only on the selected bit sequence 121, generates an m-bit pattern word 131 with bit-values ABCDEFG. Though for reasons of clarity the selector circuitry 120 has been shown here as a separate circuitry that is connected to the memory and to a decoding circuitry 130, the selector circuitry 120 is typically part of the decoding circuitry 130.

As m<n the selected n-bit sequence can contain more information than the m-bit pattern word. In particular, besides the information of the m-bit pattern word, the n-bit sequence also contains all information that is needed for decoding the n-bit sequence to generate the m-bit pattern word. Several manners of decoding are possible, as illustrated in FIGS. 3A, 3B and 3C and described later herein.

Output circuitry 140 is coupled to the comma detection circuitry 150 adapted for outputting the m-bit pattern word 131 that has been generated by the decoding circuitry if no comma detect signal d is generated. As described above, a comma detect signal d is generated in all but the last bit of the memory a comma symbol sequence is present. In such a case any selection of n-bits from the memory would contain at least one bit of the comma sequence so that decoding of that selection would result in in a somewhat random m-bit pattern word being output. The decoding device according to the present invention avoids this by not outputting a decoded m-bit pattern word when the comma detect signal has been generated.

Figure 2B:
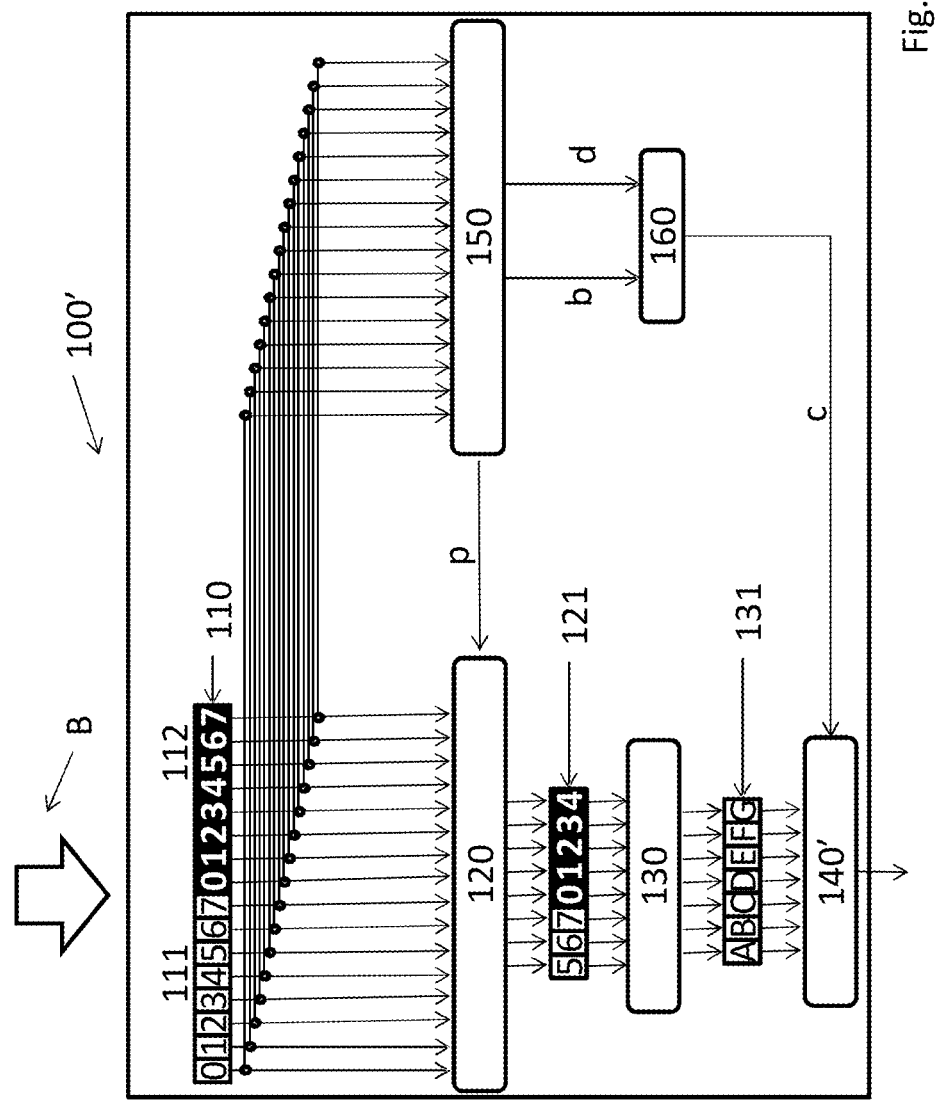

FIG. 2B shows an embodiment of another decoding device 100' according to the invention, in which like reference numbers refer to like circuits and signals. A difference between decoding device 100' and decoding device 100 of FIG. 2A is that the decoding device 100' is provided with a symbol counter circuitry 160 which is connected to the comma symbol detector circuitry 150 and to output circuitry 140'. The symbol counter circuitry 160 is adapted for, each time a new sequence of n-bits received from the input stream B is stored in the memory 110, setting a symbol counter c to zero if the comma detect signal d is generated or if the current value of the symbol counter is greater than or equal to a predetermined frame symbol count, and for otherwise increasing the symbol counter. In the embodiment shown, the symbol counter circuitry 160 generates a signal r indicative of a new sequence of n-bits having been received from the input stream, and passes the signal b on to the symbol counter circuitry 160. Alternatively, the symbol counter 160 may be connected to other means adapted for determining that a new n-bit sequence has been received, which may for instance be an external clock or pulse generator, the memory 110, selector circuitry 120 or decoding circuitry 130.

After receipt of each n-bit sequence, the symbol counter c is set to zero if time a comma symbol is detected in all but the last bit of the memory. Additionally, even if no comma symbol is detected, the symbol counter c is set to zero each time the predetermined frame symbol count number of n-bit sequences has been received without detection of a comma symbol. The output circuitry 140' is adapted for only outputting an m-bit pattern word decoded by the decoding circuitry 130 when the column counter is greater than zero. Thus, there is no output when a comma symbol is detected. Additionally, there is no output every time the predetermined frame symbol count number of n-bit sequences has been received without being followed by a comma symbol. The latter may happen for instance if the comma symbol is distorted during transmission such that one or more bits of the comma symbol are flipped and the received distorted comma symbol is not detected by the comma symbol detection circuitry.

Figure 2C:
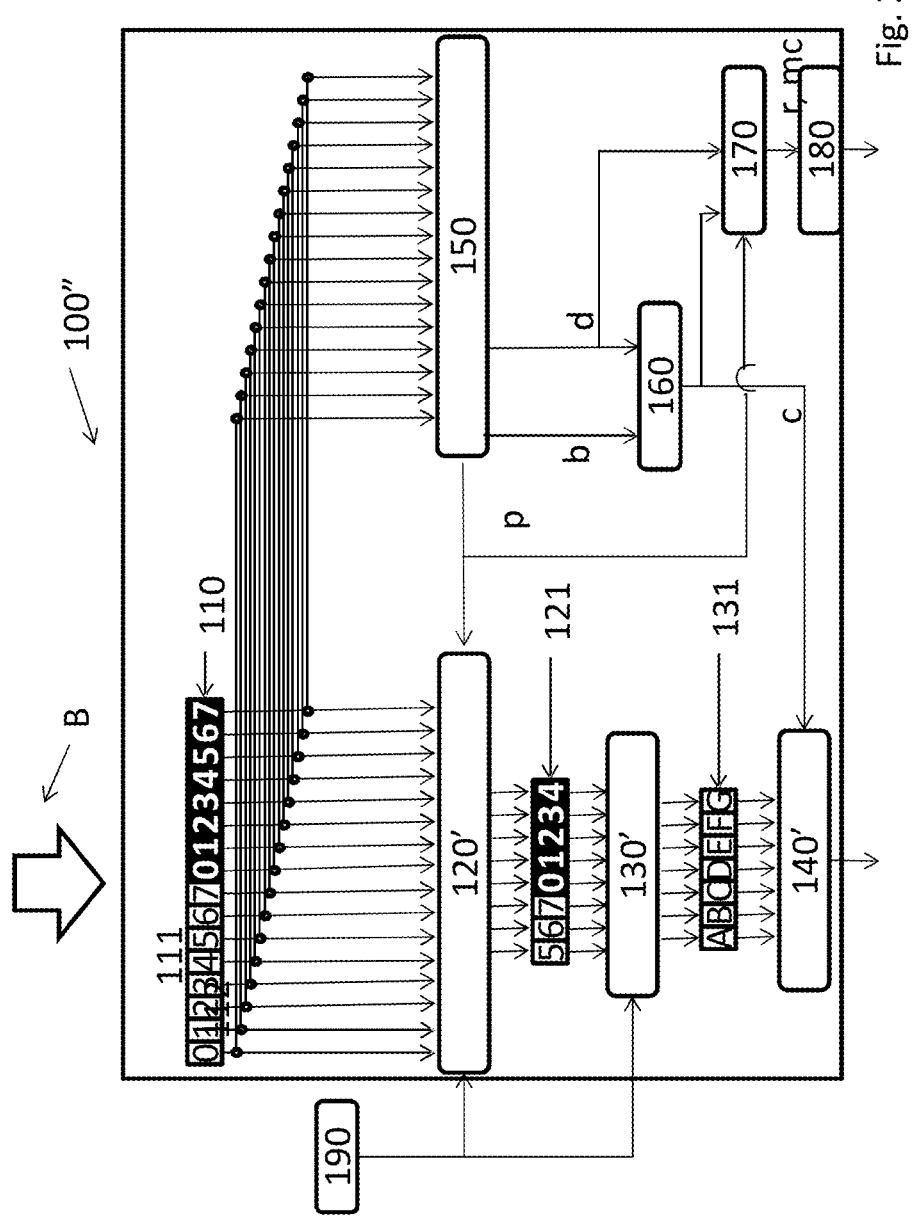

FIG. 2C schematically shows a decoding device 100" according to the invention, wherein again like reference numbers refer to like structures. The decoding device 100" is connected to a debug controller 190 which is adapted for generating a signal for switching the selector circuitry 120' and the decoding circuitry 130 between a first and a second mode of operation. In the first mode the selector circuitry 120' and the decoding circuitry 130' operate respectively in the same manner as the selector circuitry 120 and decoding circuitry 130 described herein earlier. In the second mode the selector circuitry 120' always selects bits 0 . . . 7 of the memory 110 independent of the value of the comma position signal p, and the decoding circuitry 130' does not decode the selected bits, but passes the still encoded bits 0 . . . 7 on to the output circuitry. The second mode provides a mechanism for streaming the first m-bits of the received n-bit sequences from the memory 110 to the output 140' without altering these m-bits of the received n-bit pattern sequences, and may be used for purposes of testing the decoding device and/or a device in which the decoding device is implemented, such as a beam modulator array.

The decoding device 100" is further provided with a resync detection circuitry 170 which is connected to the comma detect circuitry and to the symbol counter circuitry, and adapted for outputting resynchronization signal r if a comma detect signal d and correspond comma position signal are generated and value of the generated comma position signal is different from the value of the comma position signal that was generated immediately prior thereto. Output of such a resync signal to a device external to the decoding device 100" is through an interface 180. The external device may thus monitor how many resync signals are output to obtain a measure of how often synchronization errors occur in the received input bit-stream. In the embodiment shown the resync signal r comprises the value of the symbol counter c immediately prior to setting the symbol counter to zero when a comma detect signal is generated.

The resync detection circuitry 170 is further adapted for outputting a missed comma signal mc via the interface 180 when the value of the symbol counter is being set to the initial value without a comma detect signal being generated. The missed comma signal is thus generated each time a comma symbol is expected but not detected in the received input bit-stream. Though in the embodiment shown the resync circuitry is adapted for detecting a missed comma, it will be understood that alternatively the decoding device may be provided with a missed comma detection circuitry which is separate from the resync detection circuitry.

The decoding device 100" thus is adapted for outputting information, via the interface 180, which may be used by an external device when monitoring properties of the received input bit-stream, in particular whether comma's have been missed and/or how many times synchronization is lost. The decoding device 100" is preferably also adapted for outputting additional information, such as the comma position signal p and/or the signal b which indicates that a new sequence of n-bits has been received from the input bit-stream.

FIGS. 3A, 3B and 3C each schematically show a different example of a decoding circuitry as may be used in the present invention. FIG. 3A schematically shows the decoding circuitry 130 having as an input the bits 121 selected by the selector circuitry 120. These bits 121 are referred to as abcdefg and h. The decoding circuitry checks whether the least significant bit, i.e. the rightmost bit h, has a value of 0 or not. If the value of h is zero, then the decoding circuitry decodes the input bits by inverting bits a, c, e and g, and leaving bits b, d and f unmodified to produce an output ABCDEFG. The same output may also be achieved by inverting all bits abcdefg if h equals 0 and subsequently inverting bits b, d and f. The right most bit h of the selected bits 121 thus functions as a polarity bit based on which all bits abcdefg should be inverted or not.

If the value of h equals 1, then the decoding circuitry decodes the input bits by inverting bits b, d and f and leaving bits a, c, e and g unmodified. The same output may also be achieved if h equals 1 by inverting bits b, d and f and leaving bits a, c, e, and g unmodified, to produce output ABCDEFG.

FIG. 3B shows another decoding circuitry 130', which is adapted for generating the decoded m-bit pattern word 131 with bit values ABCDEFG based only on the selected bits 121. In FIG. 3B the symbol " ¬ " denotes a Boolean NOT operation, and the symbol "⊕" denotes a Boolean XOR operation, wherein bits A, C, E and G are generated by XOR-ing the value of bits a, c, e, and g respectively with the value of bit h, and bits B, D and F are generated by taking the complement of the values of bits b, d and f when XOR-ed with the value of bit h.

Whereas in the decoding circuitries 130 and 130' the information in bit h is used to determine how to decode the remaining bits, the decoding circuitry 130" shown in FIG. 2C makes use of information in bit e for determining how the selected bits 121 should be decoded. The decoding device 130" generates bits A, E and G by XOR-ing the value of bits b, c, and g respectively with the value of bit e, and bits B, C, D and F respectively are generated by taking the complement of the values of bits f, h, a and d when XOR-ed with the value of bit e. The output bits ABCDEGH are thus produced by performing Boolean operations using only the selected bits 121, and rearranging the order of some of the resulting bits.

Due to the simplicity of the decoding circuitries of FIGS. 3A-3C, these can be constructed using 3*n logic gates or less, or using 3*m logic gates or less, as will be apparent to the skilled person. Moreover, as the value of each bit ABCDEFG of the decoded m-bit pattern word can be calculated independent of the other bits of the decoded m-bit pattern word parallel, allowing parallel decoding of these bits. Besides the examples of FIGS. 3A-3C many other decoder schematics are possible in which decoding is based only on the selected sequence of n bits.

FIGS. 4A and 4B show as an example a table in which the contents of memory 110 at different points in time t are shown for a decoding device according to the invention. The decoding device is adapted for receiving 8-bit pattern symbols and outputting 7-bit decoded pattern words. In the example the comma symbol used has a bit sequence "0101 1100". Bit sequences in the memory 110 which correspond to this comma symbol are indicated in bold, e.g. as shown in FIG. 3A at time t=1, 3, 5, 6, 9, 11, 13, 15, 17, 18, 20 and 21.

At each point in time t a new 8-bit sequence is received from the input bit-stream. Columns p, d, c indicate the values of the column position signal, the column detect signal and the symbol counter respectively, wherein a "•" indicates that a comma detect signal has been generated and an empty cell indicates that no comma detect signal has been generated. Received 8-bit sequences for which the corresponding decoded m-bit pattern word is output during processing of an input bit-stream by the decoding device are shown in inverse font, e.g. at t=2, 4 and 6. As decoding of the selected bits of the memory may occur without the decoded bits being output, for instance if a comma symbol is decoded, not every row shows a sequence of n-bits which is decoded and subsequently output.

The symbol counter c is the symbol counter of the decoding device, and is adapted for setting the symbol counter to zero it reaches a value greater than a predetermined frame symbol count value of 7. It is expected at the decoding device that after every 7 consecutive pattern symbols, a comma symbol is received.

At t=1 a comma symbol is present in the first memory section 111, i.e. in bits 0 . . . 7 of the memory 110, and the second memory section, i.e. bits 8 . . . 15 of the memory 110, comprises a bit-sequence "1010 1010". As a comma symbol is present at location zero of the memory, the comma position signal p is set to zero, and a comma detect signal d is generated. The symbol counter c is set to zero as well and no symbol is output at t=1.

At t=2, those bits which were in the second memory section 112 at t=1 are copied to the first memory section. No comma symbol is present in bits 0 . . . 15 of the memory at t=2, so that the value of the comma position signal does not change and no comma detect signal is generated. The symbol counter increased by 1 but remains less than the predetermined frame symbol count of 7, so the selected bits 0 . . . 7 are decoded and the decoded m-bit pattern word is output.

At each of t=3, 5, 7, 9, 11, 13, 15 a comma symbol is detected at a different position in the memory and result in generation of a comma detected signal. Though at t=16 bits 8 . . . 15 of the memory contain a comma symbol, this does not result in generation of a comma detected symbol as no comma symbol is present the first 15 bits, i.e. in bits 0 . . . 14, of the memory 110.

At t=17 there are two comma symbols in the memory, one at position 0 . . . 7 and another at position 8 . . . 15. Only the comma symbol in bits 0 . . . 14 of the memory is detected and the comma position signal is set to zero. No decoded m-bit pattern word is output.

At t=18, the comma symbol that was at the second memory section 112 during t=17, has now been copied to the first memory section 111, and a new 8-bit sequence has been received and stored at position 8 . . . 15 of the memory. As a result, a first comma symbol bit sequence is present in the memory from position 0 to 7, and a second comma symbol bit sequence is present in the memory from position 7 to 14. The comma position signal is set to the position of last comma symbol that is present in bits 0 . . . 14, i.e. is set to 7. There is no output of a decoded m-bit pattern word.

At t=19, no comma symbol is present in the first 15 bits (bits 0 . . . 14) of the memory. The comma position signal has a value of zero, so that bits 7 . . . 14 of the memory are selected to be decoded, the decoded m-bit pattern word is subsequently output, and the symbol counter is increased by 1.

At t=20, a comma symbol is detected starting a position 0, so that the comma position signal and the symbol counter are set to 0. The same goes for t=21.

At t=22, no comma symbol is detected, bits 0 . . . 7 are decoded and output, and the symbol counter is increased by 1. The bits 8 . . . 11 with values "x" may each have a value of either "1" or "0", as long as these bits do not form a comma symbol sequence when appended to the first memory section 111.

FIG. 4B shows a continuation of the table shown in FIG. 4A, in which bit values of the memory indicated by an "x" or by alphabetic character followed by a number relate to random bit values which however do not form a comma bit sequence in the memory 110.

At t=23 a comma symbol is present in the memory at position 4 . . . 11, causing a comma position signal to be generated with a value of 4.

At t=24 through t=30, 8-bit sequences are received from the input bit-stream which do not form a comma symbol in the memory. At each of these times, bits 4 . . . 11 of the memory are selected, decoded, and the decoded m-bit pattern word is output while the symbol counter is increased until it reaches the value of the predetermined frame symbol count.

At t=31, a comma symbol is detected, as would be expected as 7 pattern words have been output since the last comma symbol was received.

At t=32 through t=38, 8-bit sequences received from the input bit-stream which do not form a comma symbol in the memory are selected, decoded and the decoded m-bit pattern word is output. At t=38 the value of the symbol counter is 7, and a comma symbol might be expected at t=39.

At t=39, however, instead of a comma symbol "0101 1100" a sequence "0101 1010" has been received due to bit flip at positions 6 and 7 of the comma symbol during transmission. As the value of the symbol counter immediately previous to t=39, i.e. at t=38, was 7, there is no output based on the selected bits 4 . . . 11, i.e. the received distorted comma symbol is not output as a decoded m-bit pattern word.

At t=40 and 41 bits 4 . . . 11 are decoded and the corresponding decoded m-bit pattern words are output.

At t=42 a comma symbol is detected at position 0 in the memory, causing the comma position signal to be set to 0.

FIG. 5 schematically shows a top view of beam modulator array 500 according to the present invention, comprising a semiconductor substrate 501 in which a plurality of apertures 510 are provided. The beam modulator array further comprises an array of modulators which lie in a single plane and are adapted for modulating charged particle beams which pass through the apertures 510. Each modulator is associated with an aperture 510 and comprises two electrodes 520 and 521 which are provided at the perimeter of the associated aperture 510 and are connected to a decoding device 550 by means of electrical wiring 511. For reasons of clarity, each aperture 510 is shown surrounded by only two electrodes 520, 521 with one electrical connection to the decoding device. However, each aperture may be provided with two or more electrodes around its perimeter, e.g. 4 or 8 electrodes per aperture, with several or all of those electrodes being connected to a separate wire which is connected to the decoding device 550. The decoding device 550 is provided with a light sensitive element 551 for receiving pattern data transmitted thereto in the form of a modulated light beam. The light sensitive element converts 551 such a modulated light beam into an electrical signal comprising an input bit-stream to be decoded by the decoding device. Based on the decoded input bit-stream, the modulators that are connected to the decoding device are controlled for either deflecting a beamlet passing through its corresponding aperture, or letting it pass undeflected.

Typically, and as shown, each decoding device 550 is configured for decoding an input bit-stream to m-bit pattern words, and the output of each decoding device is coupled to m separate modulators 520, with each bit of each decoded m-bit pattern word controlling whether a corresponding one of said m modulators modulates a beamlet or not. Though only 20 apertures are shown in this example, typically the beam modulator array comprises tens of thousands or more apertures and corresponding modulators. As the decoding devices 550 have a simple construction and require relatively little space they may easily be arranged in an area spanned by the modulators of the modulator array, as is the case for three of the four decoding devices shown in FIG. 5. The distance between each decoding device and its associated modulators can thus be kept relatively small, i.e. less than 10 times a maximum distance, or pitch, between two modulators that are coupled to the same decoding device. In the embodiment shown, a maximum distance between two neighboring modulators 510 which are coupled to the decoding device 550 is 50 nm, and all modulators that are coupled to that decoding device 550 are arranged at a distance of less than 1000 nm therefrom.

Figure 6B:
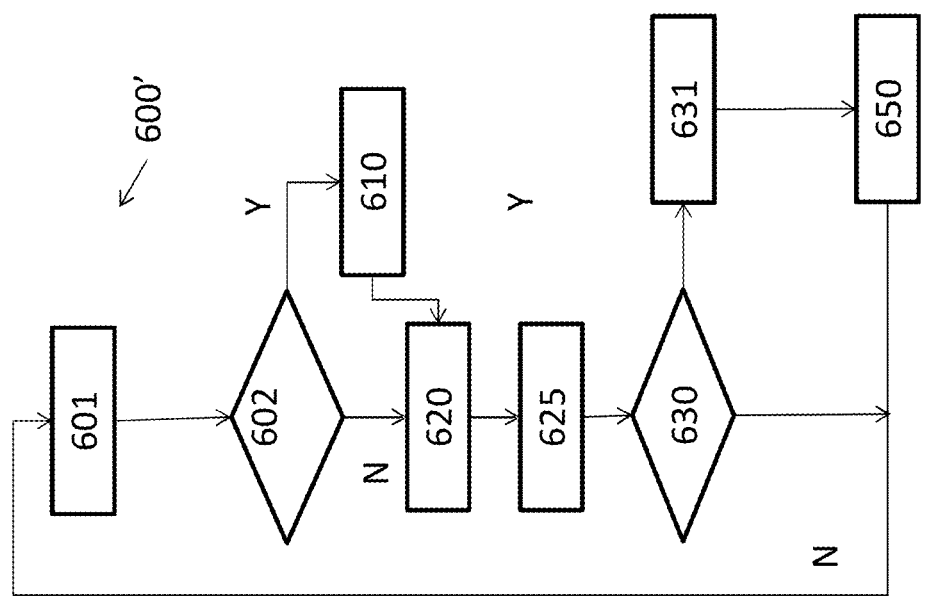
Figure 6A:
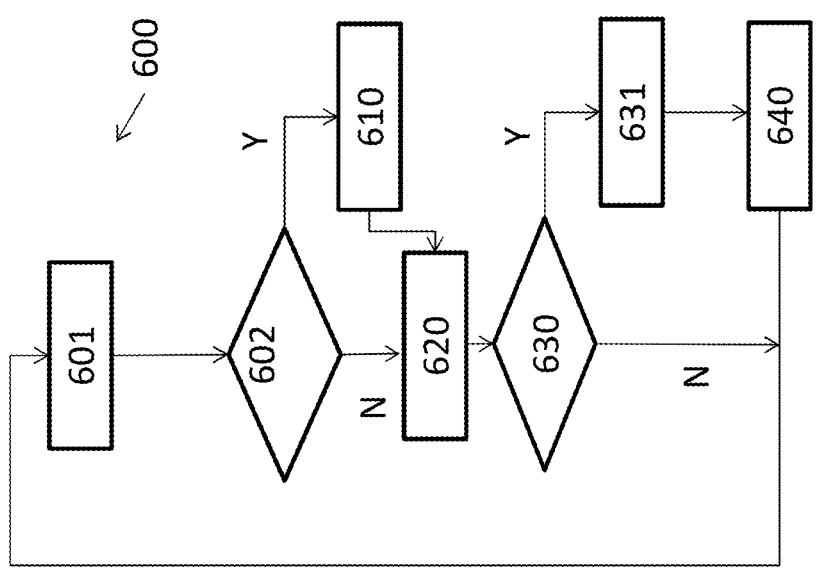

FIG. 6A shows a flowchart of a method 600 according to the present invention. In step 601 a sequence of n bits is received from an input bit-stream, for instance by a decoding device as described herein.

In subsequent step 602 it is checked whether a predetermined n-bit comma symbol is present in a concatenation of all but the last bit of the received sequence appended to a sequence of n bits received from the input bit-stream immediately prior thereto. If this is the case, a comma detect signal is generated in step 610. In step 620 a comma position signal is generated which indicates a position in the string at which the comma symbol was most recently detected. Though in the embodiment shown step 620 is performed independent of the outcome of step 602, in an alternative embodiment this step may be performed only if no comma detect signal is generated in step 702.

In step 630 it is checked whether a comma detected signal has been generated. If this is the case, then in step 631 a decoded m-bit pattern word is generated based only on a selected sequence of n-bits of the concatenation starting from the position indicated by the comma position signal, and the method proceeds to step 640 in which the decoded m-bit pattern word is output, for instance to one or more modulators of a beam modulator array for individually modulating a plurality of beamlets. Otherwise the method starts anew at step 601.

FIG. 6B shows another embodiment of a method according to the present invention. Steps 601-631 are the same as in FIG. 6A. In an additional step 625 a symbol counter is set to zero if the comma detect signal is generated or if a current value of the symbol counter is equal to a predetermined frame symbol count value greater than zero. If neither of these conditions apply, then in step 625 the symbol counter is increased by 1.

In step 650, which replaces step 640 of FIG. 6A, the decoded m-bit pattern word is output if and only if the symbol counter is greater than zero.

In summary, the invention relates to a method and decoding device for receiving an input bit-stream comprising a sequence of n-bit pattern symbols as well as a unique n-bit comma symbol for synchronization, and for generating therefrom a synchronized output comprising a sequence of m-bit pattern words, with m<n. The comma symbol allows detection of bit-skip in the input bit-stream, so that the output to be synchronized to compensate for the bit-skip. The decoding device and method of decoding are particularly simple and may be applied in devices, e.g. in a beam modulator array comprising a plurality of decoding devices, and/or in a lithography system comprising such a beam modulator array, in which space and computational resources are scarce while still providing a synchronization capability.

Figure 7A:
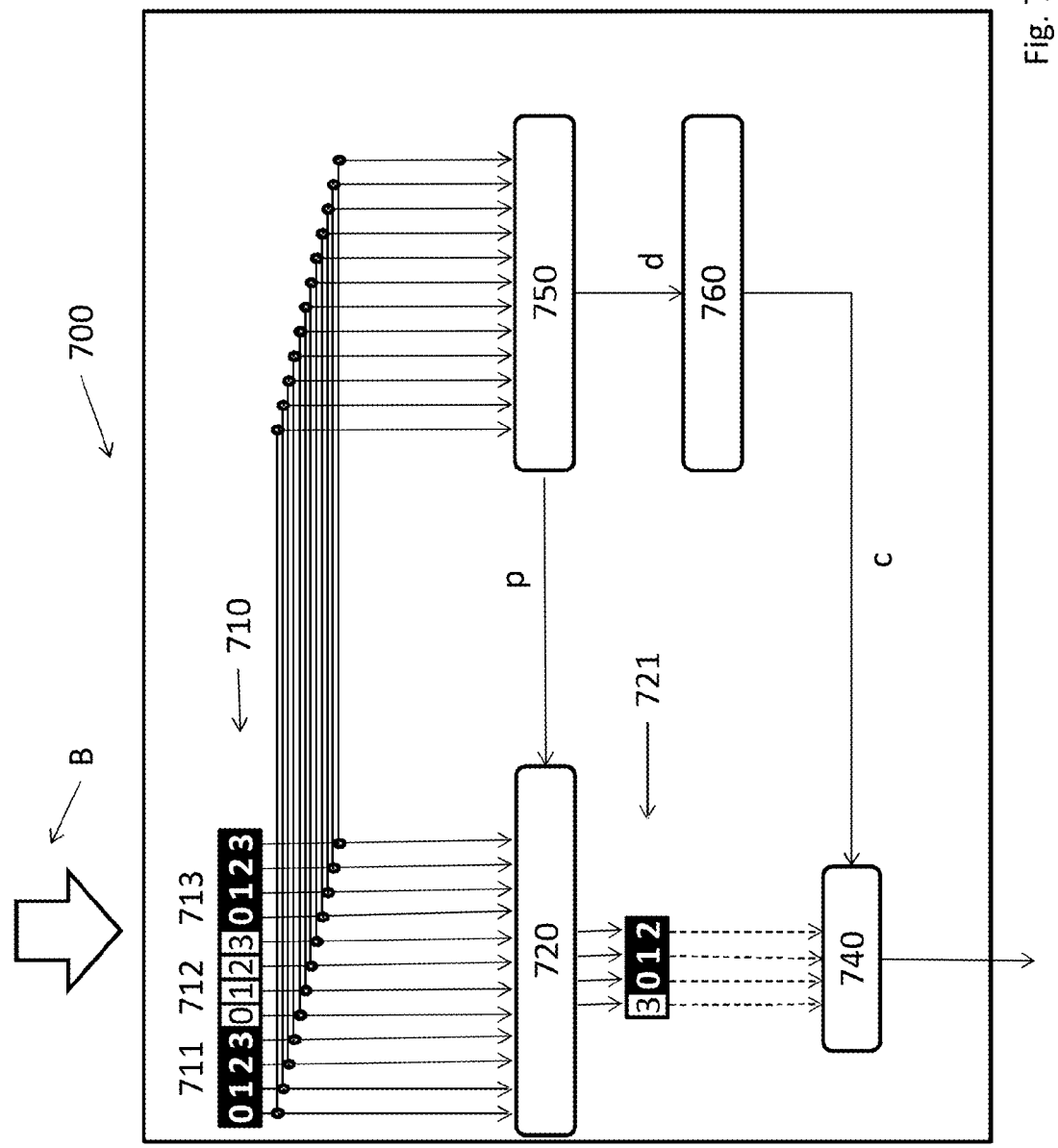

FIG. 7A schematically shows a portion of an embodiment of a decoding device 700 according to the invention, in which only the circuitry used in the synchronization is shown. The decoding device has a data width of 4, i.e. q=4, and thus is adapted for receiving 4 bits at a time from the input bit-stream. The device comprises three 4-bit memories, 711, 712 and 713 which together form a 12-bit memory 710. Each time four new bits are received from the input bit-stream B, the four bits from memory 712 are copied to the memory 711, the four bits from memory 713 are copied to the memory 712, and the newly received 4 bits are stored in the memory 713. Though the data width of the decoding device equals 4, the comma symbol has 8 bits, i.e. n=8. Comma detection circuitry 750 checks whether an n-bit comma symbol is present in all but the last bit of the memory 710, that is in the concatenation of the bits of the memories 711, 712 and all but the last bit of memory 713. If this is the case it generates a comma detect signal d. Symbol counter circuitry 760 increases a symbol counter c by 1 each time a new sequence of 4 bits is received and sets the symbol counter c to 0 if a comma detect signal d is generated. A value of zero for the symbol counter c is indicative of the start of a new frame. Whenever the symbol counter equals 0, output circuitry 740 begins decoding and outputting of a new frame of decoded m-bit pattern symbols. Whenever the symbol counter exceeds the value 15 it is reset to 0.

Regardless of whether a comma is detected in the memory 710, the circuitry 750 generates a comma position signal p indicative of a position in the memory 710 where a comma symbol was most recently been detected. Based upon this comma position signal, selector circuitry 720 selects bits 721 from the memory 710 to be passed on to a decoding circuitry (not shown) and optionally to a demultiplexing circuitry (also not shown). The four bits 721 in the present example are bit no. 3 of memory 712 and bits 0, 1 and 2 of memory 713, and the dotted lines indicate these 4 bits may pass through decoder and/or demultiplexing circuitries before a corresponding decoded m-bit pattern word is output by output circuitry 740.

Figure 7B:
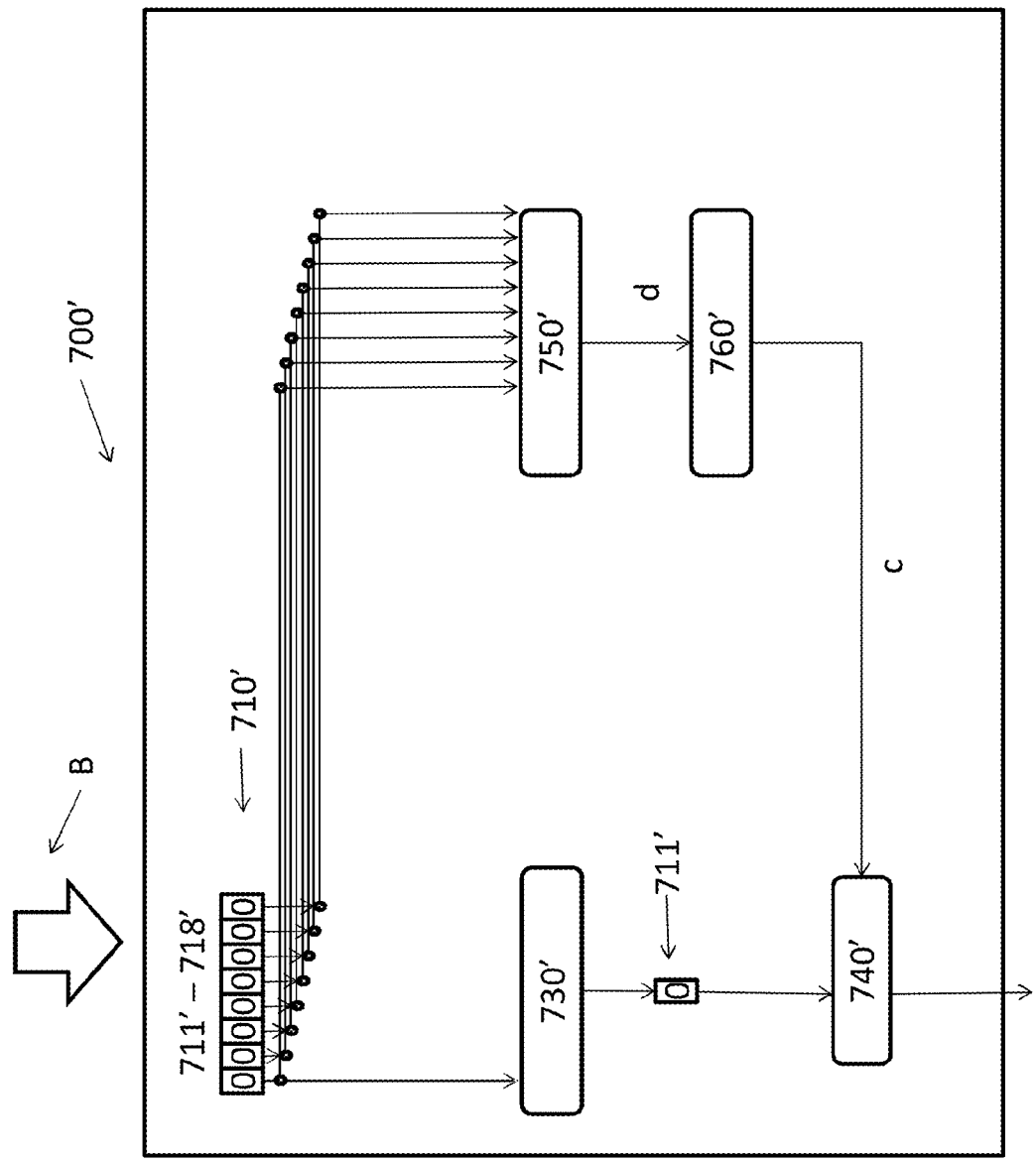

FIG. 7B schematically shows a portion of an embodiment of a decoding device 700' according to the invention, in which also only the circuitry used in the synchronization is shown. As in the embodiment of FIG. 7A, the decoding circuitry and optional demultiplexing circuitry have not been shown for reasons of clarity. However, suitable decoding circuitries such as shown in FIGS. 3A, 3B and 3C may be used in both embodiments.

The data width of the decoding device of FIG. 7B equals 1, that is q=1 and the device is adapted for receiving a single bit at a time. In order to be able to detect an n-bit comma symbol, the device is provided with n 1-bit shift registers 711'-718', which together form an n-bit memory 710'. Comma detection circuitry 750' is adapted for generating a comma detect signal d if a comma symbol bit sequence is present in the memory. Selection circuitry 730' always selects the first bit 711' of the memory, as a comma can only be detected at the first position 711' of the memory. Symbol counter circuitry 760' increases a symbol counter c by 1 each time a new sequence of 4 bits is received and sets the symbol counter c to 0 if a comma detect signal d is generated. A value of zero for the symbol counter c is indicative of the start of a new frame. Whenever the symbol counter equals 0, output circuitry 740' begins decoding and outputting of a new frame of decoded m-bit pattern symbols. Whenever the symbol counter exceeds the value 63 it is reset to 0.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:

1. Method of generating a decoded and synchronized output of m-bit pattern words from an input bit-stream comprising frames with n-bit pattern symbols as well as an n-bit comma symbol and in which bit-skip may have occurred, with m<n, said method comprising repeating the steps of:
 a) receiving a sequence of q bits from the input bit-stream, with q≥1;
 b) detecting whether a predetermined n-bit comma symbol is present in a concatenation of all but the last bit of the received sequence of q bits appended to a sequence of n bits received from the input bit-stream immediately prior thereto;
 c) determining a comma position, wherein if in step b) a comma symbol is detected, said comma position is determined to be indicative of a position at which the comma symbol was detected in said concatenation, and wherein otherwise said comma position is determined as a comma position that was most recently determined in step c);
 d) if in step b) no comma symbol was detected: selecting a predetermined number of bits of the concatenation starting from the position indicated by the comma position, said predetermined number being greater than m, and decoding said selected predetermined number of bits to generate at least one decoded m-bit pattern word based only on said selected bits, and
 outputting said at least one decoded m-bit pattern word.

2. Method according to claim 1, wherein q is equal to n and wherein said predetermined number of bits is equal to n.

3. Method according to claim 1, further comprising updating a symbol counter indicative of a number of consecutive m-bit pattern words that have been output without detecting a comma symbol in step b), said updating comprising, each time a new sequence of q bits is received from the input stream:
 if in step b) said comma symbol was detected or if the value of the symbol counter indicates that a number of consecutive pattern words has been output that is greater than or equal to a predetermined frame symbol count, setting said symbol counter to an initial value, and otherwise incrementing the symbol counter;
 wherein in step d) outputting said at least one decoded m-bit pattern word only occurs if said pattern symbol counter has a value different than said initial value.

4. Method according to claim 3, further comprising outputting a resync signal in case in step b) a comma symbol is detected and the value of the comma position during said step b) is unequal to the value of the comma position determined subsequently in step c).

5. Method according to claim 3, further comprising outputting a resync signal in case in step b) a comma symbol is detected and the value of the symbol counter does not correspond with said predetermined frame symbol count.

6. Method according to claim 1, wherein in step c) said determining of the comma position to be indicative of a position at which the comma symbol was detected in said concatenation comprises determining the comma position to be indicative of a position of a last occurrence of the comma symbol in the concatenation when starting from the first bit of the concatenation.

7. Method according to claim 1, wherein each n-bit pattern symbol comprises an encoded m-bit pattern word as well as decode information for decoding said encoded m-bit pattern word, wherein, when said n-bits of the concatenation contain an n-bit pattern symbol, decoding of said n-bits to generate the decoded m-bit pattern word comprises:
 inverting all of the m bits of the encoded m-bit pattern word or not, based on the decode information, to produce a partially decoded m-bit pattern word; and
 inverting bits at three or more predetermined bit positions of the partially decoded m-bit pattern word to generate the decoded m-bit pattern word.

8. Method according to claim 3, further comprising outputting a missed comma signal in case in step b) no comma symbol is detected and the symbol counter is set to the initial value.

9. Method according to claim 1, wherein said input bit-stream is a multiplexed input bit-stream, wherein said method further comprises demultiplexing said bits received from said input bit stream prior to outputting said at least one decoded m-bit pattern word.

10. Decoding device configured to generate a decoded and synchronized output of m-bit pattern words from an input bit-stream comprising frames with n-bit pattern words as well as an n-bit comma symbol and in which bit-skip may have occurred, with m<n, said decoding device comprising:
 a memory for storing a sequence of q bits received from the input bit-stream, with q≥1;
 comma detection circuitry adapted for generating a comma detect signal only if a comma symbol is detected in a concatenation of all but the last bit of the received sequence of q bits appended to a sequence of n bits received from the input bit-stream immediately prior thereto, and for generating a comma position signal such that said comma position signal does not change its value if no comma symbol is detected and otherwise is set to a value indicating a position in said concatenation at which said comma symbol is detected;

decoding circuitry connected to said comma detection circuitry and adapted for selecting a predetermined number of bits of the concatenation starting from the position indicated by the comma position signal, and for generating at least one decoded m-bit pattern-word based only on said selected bits;

output circuitry connected to said decoding circuitry and adapted for outputting said at least one decoded m-bit pattern word when no comma detect signal is generated.

11. Decoding device according to claim 10, wherein said memory is adapted for storing, together with the received sequence of q bits, the sequence of n bits that was received from the input bit-stream immediately prior thereto.

12. Decoding device according to claim 11, wherein said decoding circuitry is adapted for generating each bit of said decoded m-bit pattern word in parallel.

13. Decoding device according to claim 10, wherein q is equal to n and wherein said predetermined number of bits equals n.

14. Decoding device according to claim 10, wherein the comma detection circuitry is adapted for, when the comma detected signal is generated, generating the comma position signal such that it indicates the position of a last occurrence of the comma symbol in the concatenation when starting from the first bit of the concatenation.

15. Decoding device according to claim 10, further comprising symbol counter connected to the comma detection circuitry and adapted for, each time a new sequence of n-bits is received from the input bit-stream, setting a symbol counter to an initial value if the comma detect signal is generated or if the current value of the symbol counter is equal to a predetermined frame symbol count, and otherwise increasing the symbol counter;

wherein said output circuitry is adapted for only outputting said decoded m-bit pattern word when said symbol counter has a value different than the initial value.

16. Decoding device according to claim 15, further comprising:

a resync detection circuitry adapted for outputting a resync-signal in case a comma detect signal is generated together with a comma position signal which has a value unequal to a value of the comma position signal that was generated immediately prior thereto; and an interface for coupling with an external device for outputting the resync-signal to the external device.

17. Decoding device according to claim 16, wherein the resync detection circuitry is further adapted for outputting a resync signal to the external device in case a comma detected signal is generated and a value of the symbol counter does not correspond with the predetermined frame symbol count.

18. Decoding device according to claim 15, further comprising a missed comma detection circuitry adapted for outputting a missed comma signal when the value of the symbol counter is being set to the initial value without a comma detect signal being generated;

wherein said decoding device is provided with an interface for coupling with an external device for transmitting the missed comma signal to the external device.

19. Decoding device according to claim 10, wherein said selected bits comprise an encoded m-bit pattern word as well as decode information for decoding said encoded m-bit pattern word, wherein said decode circuitry is adapted, depending on the decode information, for generating the decoded m-bit pattern word as either:

the bits of the encoded m-bit pattern word in which bits at three or more predetermined bit-positions are inverted; or the bits of the encoded m-bit pattern word in which all bits other than those at the three or more predetermined bit-positions are inverted.

20. Decoding device according to claim 10, further comprising demultiplexing circuitry adapted for demultiplexing said bits received from said input bit stream prior to outputting said at least one decoded m-bit pattern word.

21. Beam modulator array comprising one or more decoding devices according to claim 10, further comprising an array of modulators for individually modulating a plurality of beamlets, wherein each of said one or more decoding devices is electrically coupled to a corresponding plurality of modulators of said array of modulators for controlling said plurality of modulators.

22. Beam modulator array according to claim 21, wherein the modulators of said array of modulators are arranged substantially within a single plane, and wherein each of said decoding devices is arranged within an area spanned by its corresponding plurality of modulators.

23. Beam modulator array according to claim 21, further comprising light sensitive elements, wherein each of said decoding devices is connected to one of said light sensitive elements, and wherein each of said light sensitive elements is arranged for receiving a modulated light beam and converting said modulated light beam to an electrical signal comprising the input bit stream for one or more of said decoding devices.

24. Beam modulator array according to claim 21, wherein each decoding device is arranged within a predetermined distance to each of the modulators coupled thereto, wherein said predetermined distance is less than or equal to 20 times a maximum distance between two neighboring modulators coupled to said decoding device, preferably less than 10 times said maximum distance.

25. Multi-beam lithography system for patterning a target, said system comprising:

a beam source for generating a plurality of beamlets for patterning said target;

a beam modulator array according to claim 21 and arranged for receiving bit-streams as input bit-streams for the one or more decoding devices of said beam modulator array.

* * * * *